(12) United States Patent
Silva (10) Patent No.: US 7,948,348 B2
(45) Date of Patent: May 24, 2011

(54) CROSS-CORE TRANSFORMER

(75) Inventor: Arturo Silva, Allen, TX (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 12/473,504

(22) Filed: May 28, 2009

(65) Prior Publication Data

US 2009/0295529 A1   Dec. 3, 2009

Related U.S. Application Data

(60) Provisional application No. 61/056,706, filed on May 28, 2008.

(51) Int. Cl.
*H01F 27/24* (2006.01)
*H01F 27/02* (2006.01)
*H01F 21/02* (2006.01)
*H01F 27/28* (2006.01)
*H01F 27/29* (2006.01)
*H01F 27/30* (2006.01)
*H01F 17/04* (2006.01)
*H01F 7/06* (2006.01)

(52) U.S. Cl. .......... 336/212; 336/83; 336/145; 336/182; 336/192; 336/198; 336/208; 336/220; 336/221; 336/222; 29/605

(58) Field of Classification Search .......... None
See application file for complete search history.

(56) References Cited

U.S. PATENT DOCUMENTS

| | | | | |
|---|---|---|---|---|
| 3,287,678 | A * | 11/1966 | Takashi Okamoto et al. | 336/83 |
| 5,696,477 | A * | 12/1997 | Yamamori et al. | 336/192 |
| 6,879,235 | B2 * | 4/2005 | Ichikawa | 336/200 |
| 6,980,077 | B1 * | 12/2005 | Chandrasekaran et al. | 336/212 |
| 7,061,358 | B1 * | 6/2006 | Yang | 336/198 |
| 7,199,569 | B1 * | 4/2007 | Nakahori | 323/355 |

* cited by examiner

*Primary Examiner* — Anh T Mai
*Assistant Examiner* — Mangtin Lian
(74) *Attorney, Agent, or Firm* — Marsh Fischmann & Breyfogle LLP (57) ABSTRACT

Core structures that may be used in transformers to improve the number of turns-ratios available. The core structures may include at least three outer legs and a center leg. In operation windings of the transformer may be wrapped around the center leg (e.g., using a bobbin) a fractional number of times, such that the turns-ratio of the transformer may be more finely selected without increasing the number of turns required. Additionally, the outer legs may have different cross-sectional areas, such that even more fractional turns-ratios are available.

12 Claims, 6 Drawing Sheets

CROSS-CORE TRANSFORMER

CROSS-REFERENCE TO RELATED APPLICATION

This application claims priority under 35 U.S.C. 119 to U.S. Provisional Application No. 61/056,706, entitled: "TECHNIQUES FOR POWER CONVERSION," filed on May 28, 2008, the contents of which are incorporated herein as if set forth in full.

BACKGROUND

Generally, magnetic components use magnetic materials for shaping and directing magnetic fields in a manner designed to achieve a desired electrical performance. Magnetic components are readily used in a wide variety of electronic equipment such as computers, televisions, telephones, etc. In operation, magnetic fields may act as the medium for storing, transferring, and releasing electromagnetic energy. Transformers are one specific example of a magnetic component, and typically comprise two or more windings of conductors (e.g., copper wire) wound around a bobbin with a magnetic core inserted through the bobbin. The bobbin may generally be made, of a molded plastic or any other suitable dielectric material. The conductors may be wound around the bobbin a predetermined number of times and in a predetermined configuration to achieve specific electrical characteristics. For example, the number of windings (e.g., a primary winding and a secondary winding) and the number of turns for the conductors in each winding may be a function of the intended application for the transformer.

To form the magnetic field in the transformer, a core assembly having high magnetic permeability may be inserted into the bobbin. Often the core assembly is made in two pieces, each having an "E" shaped cross-section that may be inserted into opposite ends of the bobbin. The transformer assembly may then be held together by various physical means such as a spring clip, tape, or an adhesive. Of course, different configurations may also be used for various applications.

Transformers generally operate on the principle that a change in current flowing through a first winding conductor, which is isolated from a second winding conductor, creates a magnetic flux in a core that causes a change in the current flow in the second winding conductor. The ratio of current in the two winding conductors may generally be related to the relative number of windings of each conductor. This may in turn create a voltage that may be the product of the number of turns multiplied by the change in magnetic flux.

Transformers are used in several applications, including power converters (or power adapters) used to power electronic devices, such as cell phones, computers, and the like. One type of power converter is a Switched Mode Power Supplies (SMPS). An SMPS may include a power supply unit and a circuit inside the unit to regulate the current. The regulating circuit may control the current so that it can stabilize it to a set voltage that is then sent to the electronic device. Due of weight, economic, and convenience factors, SMPS's are the devices of choice to power most consumer electronics that need stable current and voltage. However, they must be designed carefully to provide power with acceptable efficiency and minimal noise.

To meet these requirements, power converters may include one or more stages that include one or more magnetic components including filters, transformers, inductors, or the like. Many power converters are designed to provide multiple output voltages. A typical example is the desktop ATX computer power supply, which produces 12 V, 5 V, and 3.3 V as well as other supplies. The 12 V, 5 V, and 3.3 V supplies all require tight voltage regulation and must produce a large output current. In order to produce all of the desired output voltages from a single transformer, the turns-ratio of the transformer between the primary and secondary windings should match the input voltage relative to the output voltages plus any rectifier voltage drops in the output stages. In order to keep the transformer secondary turns to a minimum, some error is often introduced into the output voltages due to use of integer turns-ratios in low numbers.

As can be appreciated, it may be desirable to have relatively few secondary windings for various reasons. For example, since the voltage may be "stepped down" from the primary windings to the secondary windings (e.g., from 120 V down to 3.3 V), the turns-ratio may be very large, which requires a large number of turns for the primary windings relative to the secondary windings. Second, since the secondary windings may generally carry a relatively large amount of current, windings having a relatively large cross-section may be used, which increases the physical space required by the windings. By utilizing relatively few turns, the physical space required by the secondary windings and the primary windings may be reduced.

In present transformers, the secondary windings may typically be wound with an integral number of turns—some of them employing half-turns to slightly increase the turns-ratio accuracy. As a result, most power supplies either provide output voltages with increased error due to turns-ratio errors, or they use a complex pulse with modulation (PWM) type method on the output stage to increase cross-conduction accuracy. Another method modulates a synchronous FET to increase or decrease the loss across it, between fully on, and a diode voltage drop equivalent to the body diode of the MOSFET. Other methods use a single secondary output (e.g., one voltage level at the output), and then use magnetic amplifiers or MOSFETs to further modulate the highest-voltage PWM signal down to lower average voltages that can then be filtered to produce the other DC output voltages. However, these solutions are complex and costly.

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

According to a first aspect, a core assembly that may be used in a magnetic component is provided. The core assembly includes a center leg, and at least three outer legs coupled to the center leg such that a magnetic circuit is formed by the center leg and the at least three outer legs when alternating current is present proximate to the core assembly. In addition, gaps are formed between each of the at least three outer legs such that a winding may enter and exit the core assembly through the gaps.

According to a second aspect, a transformer is provided that includes a core assembly, a primary winding, and a secondary winding. The core assembly includes a center leg, and at least three outer legs coupled to the center leg such that a magnetic circuit is formed by the center leg and the at least three outer legs when alternating current is present proximate to the core assembly. In addition, gaps are formed between each of the at least three outer legs such that a winding may enter and exit the core assembly through the gaps. The primary winding has a portion wrapped around the center leg a predetermined number of times, and a first end and a second end passing through at least one of the gaps between the outer legs. The secondary winding has a portion wrapped around the center leg a predetermined number of times, and a first end and a second end passing through at least one of the gaps between the outer legs.

According to a third aspect, a method for assembling a magnetic component is provided. The method includes providing a pair of core halves, each of the core halves including a base and at least three outer legs extending therefrom, a center leg extending from the base in the same direction as the outer legs, wherein gaps are formed in the spaces between the outer legs. The method also includes providing a substantially hollow bobbin that receives each center leg of the core halves, the bobbin including a winding surface. Further, the method includes winding a first conductor around the bobbin, and winding a second conductor around the bobbin. In addition, the method includes inserting the center legs of each of the core halves into the bobbin.

In addition to the exemplary aspects and embodiments described above, further aspects and embodiments will become apparent by reference to the drawings and by study of the following descriptions.

DETAILED DESCRIPTION

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

Figure 1:
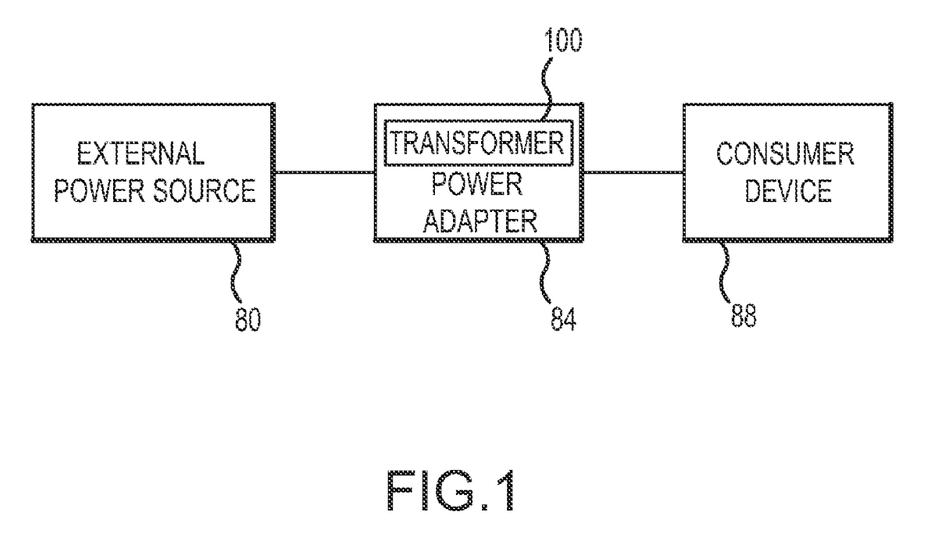
FIG. 1 illustrates a power adapter application that includes an exemplary transformer.

FIG. 1 illustrates an application in which an exemplary transformer 100 may be used. As shown, the transformer 100 may be included as a component in a power adapter 84 for a consumer device 88. The consumer device 88 may be a portable computing device (e.g., a notebook computer, a personal digital assistant, a tablet PC, or the like), or a mobile telephone, portable music player, desktop computer, or the like. The power adapter 84 may function to modify the output from an external power source 80 to a level that is suitable for the consumer device 88. As noted above, the power adapter 84 (or converter) may include multiple output voltage levels (e.g., 12 V, 5 V, 3.3 V, or the like), which may be provided by including multiple secondary windings on the transformer 100.

Figure 2A:
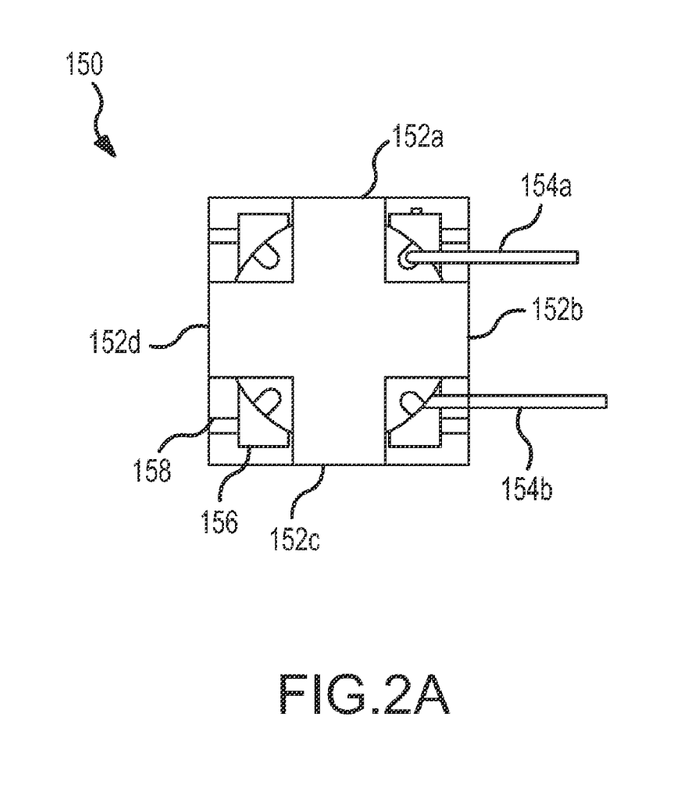
FIG. 2A illustrates a top view of an exemplary cross-core transformer.
Figure 2B:
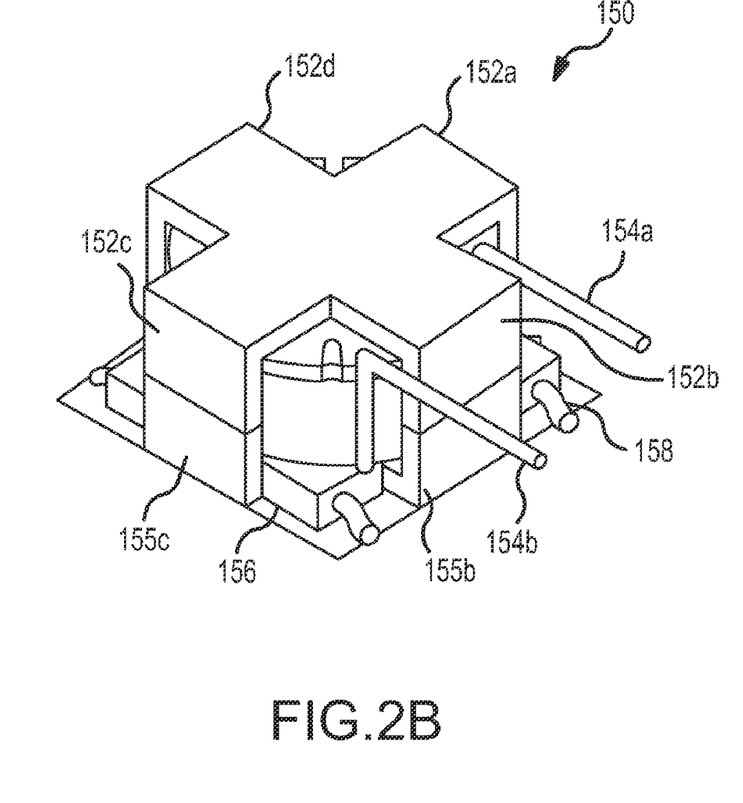
FIG. 2B illustrates a perspective view of the exemplary cross-core transformer shown in FIG. 2A.

The nature of the transformer core structures (or assemblies) described herein allow for fractional numbers of turns (as opposed to integer numbers of turns) for the windings, such that a designer can create a more accurate turns ratio while still using a relatively small number of turns. FIGS. 2A-B illustrate a top view (FIG. 2A) and a perspective view (FIG. 2B) of a core structure 150 that has a cross-section in the shape of a cross. That is, the core structure 150 may be formed from two pieces of material to include a top half having four outer legs 152a-d, and a bottom half including four outer legs (only the outer legs 155b and 155c can be seen). The top and bottom halves of the core structure 150 may also include a center leg (not viewable in FIGS. 2A-2B) that is inserted into an opening of a bobbin 156. The bobbin 156 may have one or more primary and secondary windings (e.g., windings 154a-b) wrapped around a winding surface. Further, the bobbin 156 may include a plurality of pins (e.g., pins 158) for securing the core structure 150 to a printed circuit board (PCB), and/or for coupling the windings to other circuitry. As an example the core structure may be made from a ferrite material, ferrous powder, or the like.

By configuring a winding to enter and exit at any of four locations on the core structure 150 (e.g., the gaps between the legs 152a and 152b, between the legs 152b and 152c, between the legs 152c and 152d, and between the legs 152d and 152a), a designer can produce a winding configuration that is a multiple of a quarter-turn (e.g., ¼ turn, ½ turn, and ¾ turn). In this regard, the turns-ratio can be more finely selected, which enables a designer to select a turns-ratio that will provide a closer approximation to the desired output voltage for the particular application.

Figure 2C:
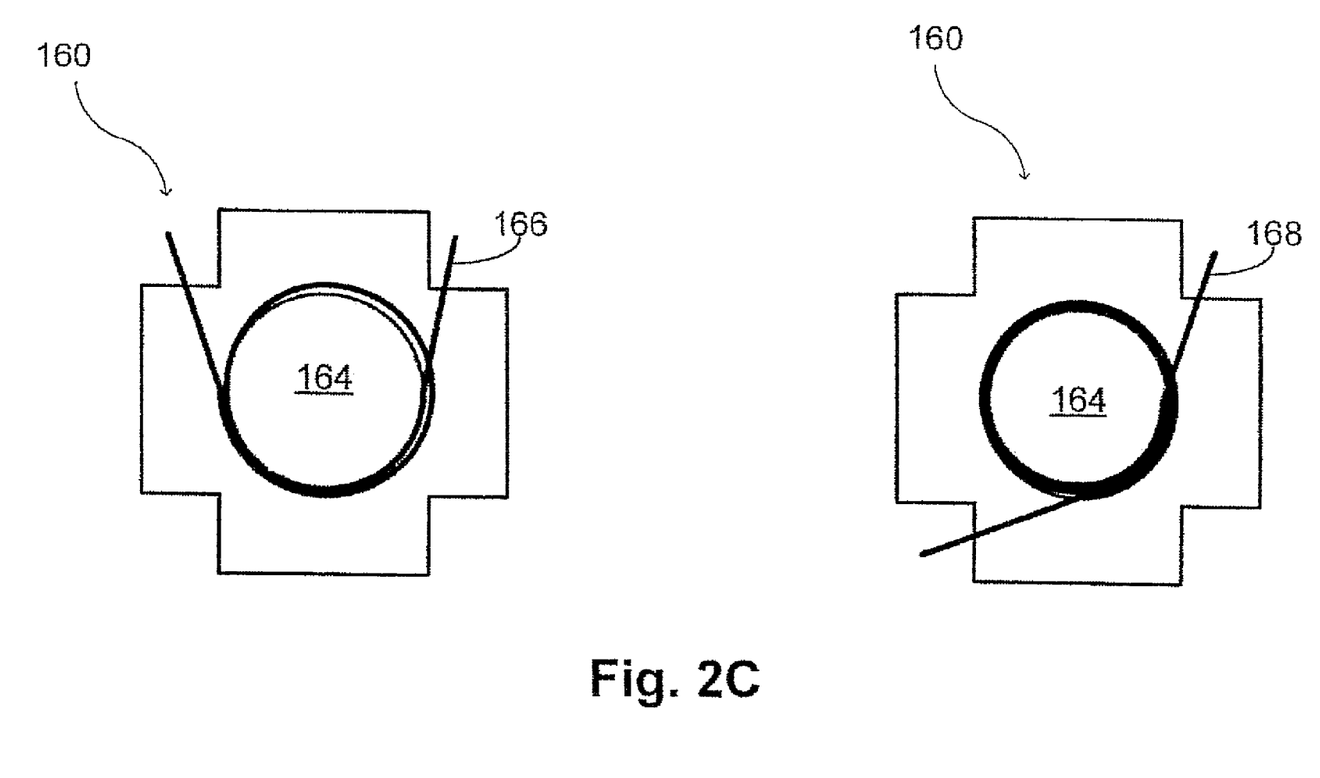
FIG. 2C illustrates top views of an exemplary core structure with first and second secondary windings wound a different number of times.

FIG. 2C illustrates a case with a first secondary winding 166 and a second secondary winding 168 wound about the center leg 164 of a core structure. The drawing is shown in two parts for clarity to illustrate that the first secondary winding 166 is wound about the center leg 164 a different number of times than the second secondary winding 168.

Figure 3:
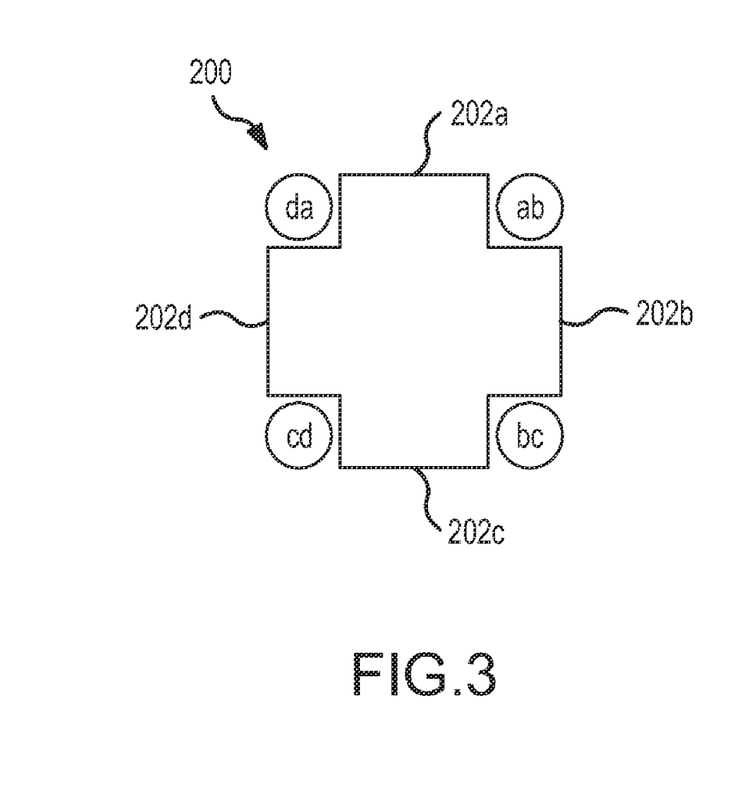
FIG. 3 illustrates a top view of an exemplary core structure that may be used with a transformer.
Figure 4:
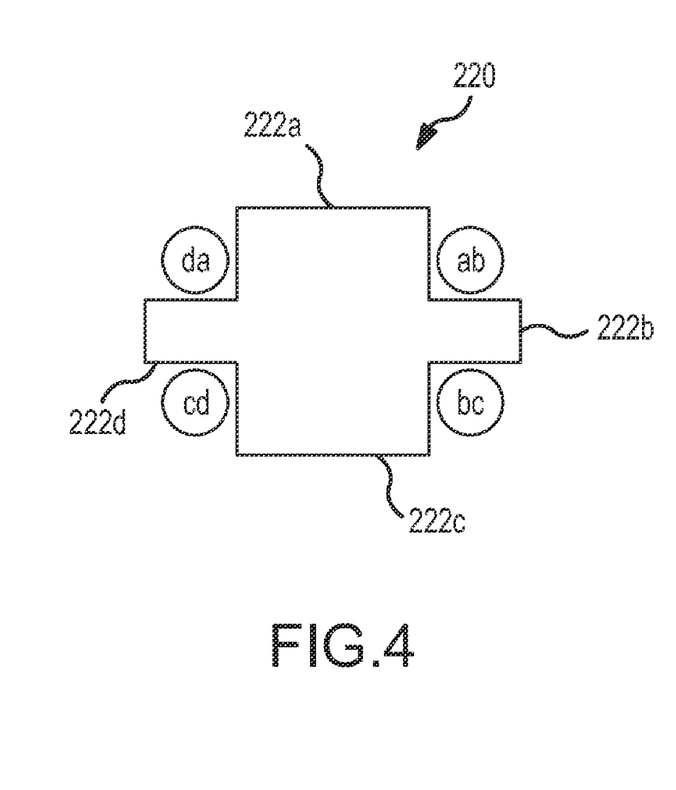
FIG. 4 illustrates a top view of another exemplary core structure that may be used with a transformer.

FIGS. 3 and 4 illustrate top views of two core structures 200 and 220, respectively. As shown, the core structure 200 includes four legs 202a-d that have equal cross-sectional areas. In this regard, a user may wrap a winding around a bobbin in a way such that the winding enters the core structure 200 at one of the gap locations ab, bc, cd, or da, and exits the core at one of those locations. Since the cross-sectional area of the legs 202a-d are substantially equivalent, the magnetic flux passing through each of the legs 202a-d will be equal. Therefore, each quarter of a turn for a winding will correspond to a quarter of the voltage change between full turns of the winding. For example, if a secondary winding has an output of 10 volts with 10 turns, and 12 volts with 11 turns, then the voltage at 10¼ turns, 10½ turns, and 10¾ turns will be 10.5 volts, 11 volts, and 11.5 volts, respectively. In this regard, it is possible achieve more accurate voltages on the secondary side of a transformer without increasing the number of turns for the windings.

As noted, it may be undesirable to substantially increase the number of turns for the windings because, among other things, the windings may be have a relatively large diameter due to their current carrying requirements. Additionally, in the case of step down transformer applications, increasing the number of turns for a secondary winding may greatly increase the number of turns required for the primary winding.

FIG. 4 illustrates a top view of the core structure 220, which includes multiple legs 222a-d with differing cross-sectional areas. In this regard, other desirable voltage levels may be achieved by utilizing quarter turns of the windings. In this example, the legs 222a and 222c may each have a cross-sectional area that is 40% of the cross-sectional area of the center leg (not shown) of the core structure 150, and the legs 222b and 222d may have cross-sectional areas that are each 10% of the cross-sectional area of the center leg. Thus, a voltage that is equivalent to 9/10 of a full turn may be achieved using the core structure 220 by wrapping a winding past the two 40% legs 222a, 222c and one of the 10% legs 222b, 222d (e.g., 40%+40%+10%=90%). As an example, one end of a winding may enter the core structure 220 at the "bc" gap, the winding may be wrapped (clockwise in the view of FIG. 4) around a bobbin N times, and the other end may exit the core structure 220 at the "ab" gap, to achieve an equivalence of N+0.9 turns. As another example, one end of a winding may enter the core structure 220 at the "ab" gap, the winding may be wrapped (clockwise in the view of FIG. 4) around a bobbin N times, and the other end may exit the core structure 220 at the "be" gap, to achieve an equivalence of N+0.1 turns. Those skilled in the art will readily recognize that numerous other combinations of number of legs and variable cross sections may be utilized to achieve the desired functionality.

Figure 5:
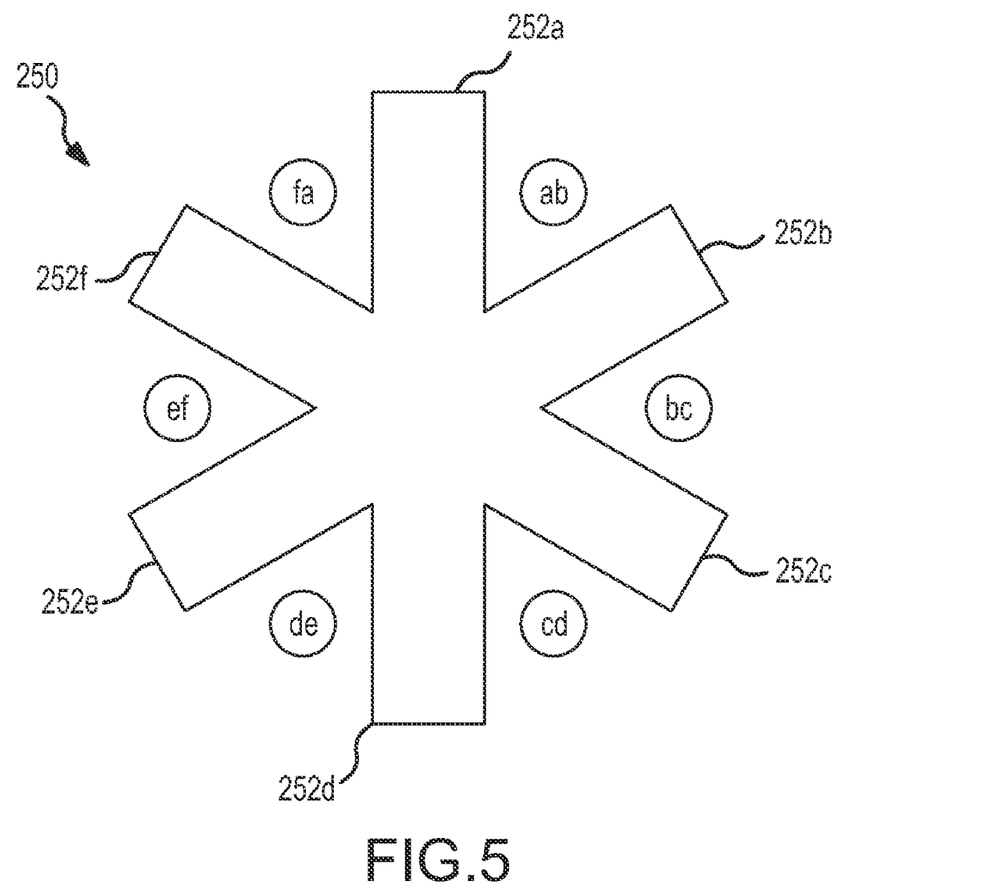
FIG. 5 illustrates a top view of another exemplary core structure that may be used with a transformer.

The shape of the core may be modified to allow any desired number of equally-spaced winding exits for applications that require, for example, a multiple of a fifth of a turn, a sixth of a turn, etc. For example, FIG. 5 shows a top view of a cross-section of a core structure 250 designed to allow multiples of a sixth of a turn. The core-structure includes six legs 252a-f and six gaps between the legs labeled ab, bc, cd, de, ef, and fa. Similar to the core structure 200 shown in FIG. 3, fractional turns may be achieved using the core structure 250 by wrapping a winding appropriately. For example, a winding may enter the core at the gap "ab," be wrapped clockwise N times, and exit the structure 250 at the gap "bc," thereby providing the equivalence of N+0.167 turns.

Figure 6:
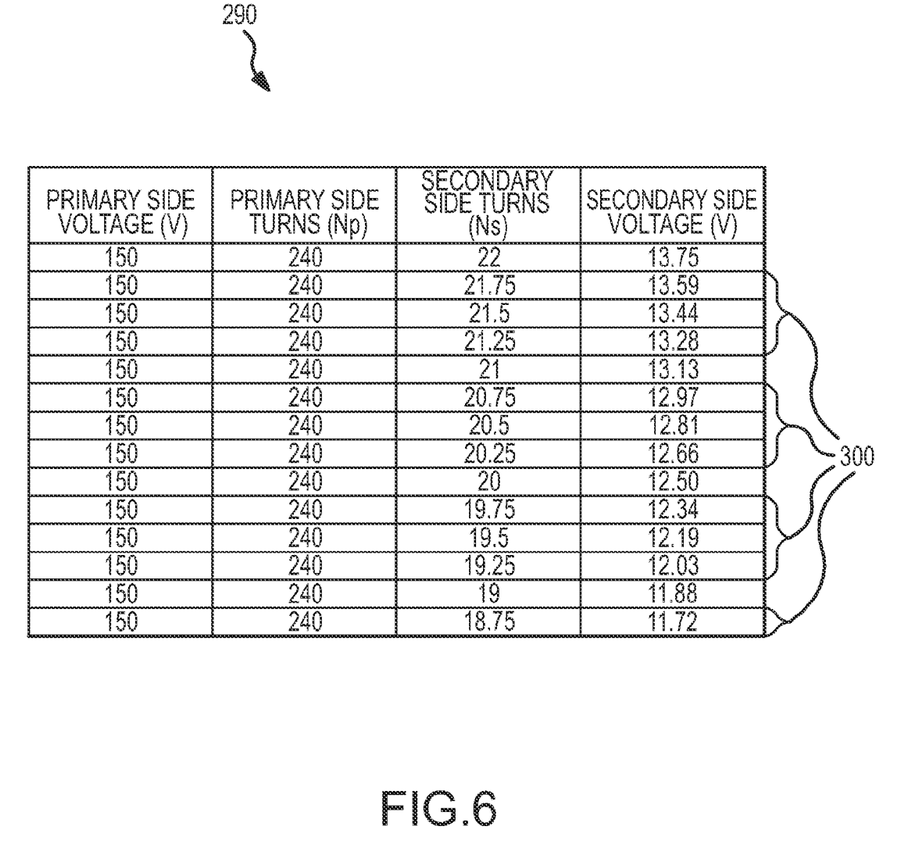
FIG. 6 illustrates a table that includes data relating to voltages and turns-ratios for an exemplary cross-core transformer.

FIG. 6 is a table 290 that illustrates the advantages of the core structures described herein. The data shown in the table 290 may be for a transformer that includes a core structure that has four legs having equal cross-sectional areas and spaced 90 degrees apart from each other, such as the core structure 150 shown in FIGS. 2A-B. The first column in the table 290 represents an AC voltage applied to a primary winding of the transformer. The second column represents the number of turns in the primary winding, and the third column represents the number of turns in the secondary winding. Finally, the fourth column represents the AC voltage that is present across the secondary winding for the conditions established by the data in columns 1-3 for the same row.

As shown in the third column (Secondary Side Turns), the core structure provides for the ability to implement ¼, ½, ¾, and full turns. The reference numeral 300 points to voltage levels at the secondary winding that are available when using fractional turns. As can be seen, utilizing a core structure that allows fractional turns permits users to select voltage levels that are more accurate than could be achieve without substantially increasing the number of turns required. It will be appreciated that the data in the table 290 relates to an ideal transformer, and is presented for illustrative purposes. In this regard, the non-ideal behavior (e.g., various losses) present in an actual transformer is not represented.

It should be appreciated that the core structures described herein have several benefits and advantages over previous designs. By providing multiple legs, fractional turns may be possible, thereby providing a larger number of potential turns-ratios for a transformer without the need to increase the number of windings. Further, for transformers with multiple primary or secondary windings, more combinations of turns-ratios may be achieved. In addition, by providing core structures that include multiple legs with unequal cross-sectional areas, an even greater number of turns-ratios may be achieved. It will be appreciated by those skilled in the art that the features and embodiments described herein may have other advantages and may be useful in a variety of applications.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed:

1. A transformer comprising:
a bobbin having a winding surface;
a core assembly having:
    a center leg inserted into an opening of the bobbin; and
at least three outer legs disposed circumferentially about the center leg and coupled to the center leg such that a magnetic circuit is formed by the center leg and the at least three outer legs when alternating current is present proximate to the core assembly, wherein at least one of the at least three outer legs has a cross-sectional area different than another of the at least three outer legs; and
a winding wound about the winding surface, the winding having a first end entering the core assembly at a first gap between a first pair of the outer legs and having a second end exiting the core assembly at a second gap between a second pair of the outer legs, the second gap being different from the first gap.

2. The transformer of claim 1, wherein the at least three outer legs each have a substantially rectangular cross-sectional area.

3. The transformer of claim 1, wherein the core assembly has exactly four outer legs.

4. The transformer of claim 1, wherein the outer legs and center leg are formed from two pieces of material.

5. The transformer of claim 1, wherein the core assembly includes ferrite material.

6. The transformer of claim 1, wherein a cross-sectional area of the center leg is substantially equal to a sum of cross-sectional areas of the outer legs.

7. The transformer of claim 1 wherein the winding comprises a first winding, the transformer further comprising:
a secondary winding wound about the winding surface, the secondary winding having a first end entering the core assembly at a third gap between a third pair of the outer legs and having a second end exiting the core assembly at a fourth gap between a fourth pair of the outer legs.

8. The transformer of claim 7, wherein the fourth gap is different from the third gap.

9. The transformer of claim 7, wherein the secondary winding comprises a first secondary winding, the transformer further comprising:

a second secondary winding wound about the winding surface, the second secondary winding wrapped around the winding surface a different number of times than the first secondary winding.

10. The transformer of claim 9, wherein the second secondary winding has a first end entering the core assembly at a fifth gap between a fifth pair of the outer legs and exiting the core assembly at a sixth gap between a sixth pair of the outer legs, the sixth gap being different from the fifth gap.

11. The transformer of claim 7, wherein the at least three outer legs of the core assembly each have a substantially rectangular cross-sectional area.

12. The transformer of claim 7, wherein the core assembly has exactly four outer legs.

* * * * *